US008048329B2

(12) United States Patent
Kamarehi et al.

(10) Patent No.: US 8,048,329 B2
(45) Date of Patent: Nov. 1, 2011

(54) METHODS FOR IMPLEMENTING HIGHLY EFFICIENT PLASMA TRAPS

(75) Inventors: Mohammad Kamarehi, Gaithersburg, MD (US); Ing-Yann Albert Wang, Moraga, CA (US)

(73) Assignee: Lam Research Corporation, Fremont, CA (US)

( * ) Notice: Subject to any disclaimer, the term of this patent is extended or adjusted under 35 U.S.C. 154(b) by 286 days.

(21) Appl. No.: 12/504,525

(22) Filed: Jul. 16, 2009

(65) Prior Publication Data

US 2009/0278054 A1    Nov. 12, 2009

Related U.S. Application Data

(62) Division of application No. 11/318,360, filed on Dec. 23, 2005, now Pat. No. 7,562,638.

(51) Int. Cl.
*H01J 27/00*    (2006.01)
(52) U.S. Cl. .............. 216/70; 118/723 MW; 250/396 R; 250/424; 250/428; 313/231.01; 315/111.71
(58) Field of Classification Search .................. None
See application file for complete search history.

(56) References Cited

U.S. PATENT DOCUMENTS

| | | | |
|---|---|---|---|
| 2,627,571 A | 2/1953 | Hiehle et al. | |
| 2,747,184 A | 5/1956 | Kock | |
| 2,772,402 A | 11/1956 | Kiyo | |
| 3,589,177 A * | 6/1971 | Merlo | 73/114.29 |
| 3,643,054 A | 2/1972 | Forster | |
| 4,132,613 A | 1/1979 | Penfold et al. | |
| 4,270,999 A | 6/1981 | Hassan et al. | |
| 4,313,044 A | 1/1982 | Staats | |
| 4,319,856 A | 3/1982 | Jeppson | |
| 4,634,914 A | 1/1987 | Ballato | |
| 4,804,431 A * | 2/1989 | Ribner | 156/345.29 |
| 4,861,955 A | 8/1989 | Shen | |
| 5,082,517 A | 1/1992 | Moslehi | |

(Continued)

FOREIGN PATENT DOCUMENTS

JP    52003744 A    1/1977

OTHER PUBLICATIONS

"International Search Report", Issue in PCT Application No. PCT/US2006/62447, Mailing Date: Mar. 27, 2008.

(Continued)

*Primary Examiner* — Allan Olsen
(74) *Attorney, Agent, or Firm* — IP Strategy Group, P.C.

(57) ABSTRACT

A method for minimizing microwave leakage into processing chamber of a microwave plasma system is provided. The method includes securing plasma traps to a plasma tube assembly, which is a cylindrical structure positioned upstream from the processing chamber and has a plasma-sustaining region. The plasma traps are electrically conductive disks surrounding the cylindrical structure and are positioned upstream from the processing chamber. The plasma traps include at least two electrically conductive disks. Each electrically conductive disk includes corrugated outer surfaces with plurality of corrugated peaks. The corrugated outer surface of the first electrically conductive disk is facing a corrugated outer surface of the second electrically conductive disk in a space-apart relationship to form an interstitial region between the electrically conductive disks. Both electrically conductive disk and the interstitial region form one of a set of upstream plasma traps and a set of downstream plasma traps relative to the plasma-sustaining region.

20 Claims, 9 Drawing Sheets

U.S. PATENT DOCUMENTS

| | | | |
|---|---|---|---|
| 5,134,965 | A | 8/1992 | Tokuda et al. |
| 5,148,129 | A * | 9/1992 | Bolton .......................... 333/20 |
| 5,498,308 | A | 3/1996 | Kamarehi et al. |
| 5,569,363 | A | 10/1996 | Bayer et al. |
| 5,734,143 | A | 3/1998 | Kawase et al. |
| 5,738,281 | A | 4/1998 | Zurecki et al. |
| 5,783,023 | A | 7/1998 | Oh et al. |
| 5,846,330 | A | 12/1998 | Quirk et al. |
| 5,846,883 | A | 12/1998 | Moslehi |
| 5,917,389 | A | 6/1999 | Moeller et al. |
| 5,961,851 | A | 10/1999 | Kamarehi et al. |
| 5,996,528 | A | 12/1999 | Berrian et al. |
| 6,163,007 | A | 12/2000 | Tanaka et al. |
| 6,210,458 | B1 | 4/2001 | Shindo et al. |
| 6,230,651 | B1 | 5/2001 | Ni et al. |
| 6,263,830 | B1 | 7/2001 | Kamarehi et al. |
| 6,352,050 | B2 | 3/2002 | Kamarehi et al. |
| 6,401,653 | B1 | 6/2002 | Taniguchi et al. |
| 6,412,438 | B2 | 7/2002 | Kamarehi et al. |
| 6,439,155 | B1 | 8/2002 | Kamarehi et al. |
| 6,603,269 | B1 | 8/2003 | Vo et al. |
| 6,652,711 | B2 | 11/2003 | Brcka et al. |
| 6,927,374 | B2 | 8/2005 | Hu et al. |
| 7,682,482 | B2 * | 3/2010 | Yoshida et al. .......... 156/345.41 |
| 2001/0020616 | A1 | 9/2001 | Drozd et al. |
| 2002/0007912 | A1 | 1/2002 | Kamarehi et al. |
| 2002/0011214 | A1 | 1/2002 | Kamarehi et al. |
| 2002/0011310 | A1 | 1/2002 | Kamarehi et al. |
| 2002/0023589 | A1 | 2/2002 | Kondo et al. |
| 2002/0050323 | A1 | 5/2002 | Moisan et al. |
| 2002/0112819 | A1 | 8/2002 | Kamarehi et al. |
| 2002/0125225 | A1 | 9/2002 | Smith et al. |
| 2003/0192645 | A1 | 10/2003 | Liu et al. |
| 2004/0182834 | A1 | 9/2004 | Kamarehi |
| 2005/0238817 | A1 | 10/2005 | Ho |
| 2006/0219361 | A1 | 10/2006 | Wang et al. |
| 2007/0134894 | A1 | 6/2007 | Chandler et al. |
| 2007/0144441 | A1 | 6/2007 | Kamarehi et al. |
| 2007/0145020 | A1 | 6/2007 | Kamarehi et al. |
| 2007/0145021 | A1 | 6/2007 | Wang et al. |
| 2007/0193516 | A1 * | 8/2007 | Yoshida et al. ........ 118/723 MW |
| 2009/0278054 | A1 * | 11/2009 | Kamarehi et al. ............ 250/424 |

OTHER PUBLICATIONS

Wang, et al., "U.S. Appl. No. 11/317,517", filed Dec. 23, 2005.
"International Preliminary Report on Patentability", Issued in PCT Application No. PCT/US2006/062446; Mailing Date: Jul. 3, 2008.
"Written Opinion", Issued in PCT Application No. PCT/US2006/062446, Mailing Date: Nov. 15, 2007.
"International Preliminary Report on Patentability", Issued in PCT Application No. PCT/US2006/062447; Mailing Date: Jul. 31, 2008.
"International Search Report", Issued in PCT Application No. PCT/US2006/062446; Mailing Date: Nov. 15, 2007.
"International Search Report", Issued in PCT Application No. PCT/US081062445; Mailing Date: Aug. 28, 2008.
"Written Opinion", Issued in PCT Application No, PCT/US06/062445; Mailing Date: Aug. 28, 2008.
"International Preliminary Report on Patentability", Issued in PCT Application No. PCT/US2006/062445, Mailing Date: Oct. 16, 2008.
Kamarehi, et al., "U.S. Appl. No. 11/318,360", filed Dec. 23, 2005.
Wang, et al., "U.S. Appl. No. 11/317,961", filed Dec. 23, 2005.
"Non Final Office Action", U.S. Appl. No. 11/317,874, Mailing Date: Oct. 20, 2006.
"Non Final Office Action", U.S. Appl. No. 11/317,874, Mailing Date: Jan. 24, 2008.
Soto et al., "Analysis, Design, and Experimental Verification of Microwave Filters for Safety Issues in Open-Ended Waveguide Systems", IEEE Transactions on Microwave Theory and Techniques, Nov. 2000, vol. 48, No. 11, pp. 2133-2140.
"Final Office Action", U.S. Appl. No. 11/317,874, Mailing Date: Apr. 19, 2007.
"Written Opinion", Issued in PCT Application No. PCT/US2006/082447, Mailing Date: Mar. 27, 2008.
"Final Office Action", U.S. Appl. No. 11/317,874, Mailing Date: Aug. 21, 2008.
"Non Final Office Action", U.S. Appl. No. 11/317,961, Mailing Date: Dec. 12, 2006.
"Final Office Action", U.S. Appl. No. 11/317,961, Mailing Date: Jul. 2, 2007.
"Non Final Office Action", U.S. Appl. No. 11/317,961, Mailing Date: Mar. 18, 2008.
"Final Office Action", U.S. Appl. No. 11/317,961, Mailing Date: Oct. 16, 2008.
Kamarehi et al., U.S. Appl. No. 11/317,874, filed Dec. 23, 2005.
"Non Final Office Action", U.S. Appl. No. 11/317,517, Mailing Date: Dec. 12, 2006.
"Final Office Action", U.S. Appl. No. 11/317,517, Mailing Date: Jul. 2, 2007.
"Non Final Office Action", U.S. Appl. No. 11/317,517, Mailing Date: Dec. 19, 2007.
"Final Office Action", U.S. Appl. No. 11/317,517, Mailing Date: Jun. 26, 2008.
"Non Final Office Action", U.S. Appl. No. 11/318,360, Mailing Date: Mar. 20, 2008.
"Non Final Office Action", U.S. Appl. No. 11/318,360, Mailing Date: Aug. 20, 2008.
"Final Office Action", U.S. Appl. No. 11/318,360, Mailing Date: Feb. 6, 2009.
"Notice of Allowance and Fees Due", U.S. Appl. No. 11/317,874, Mailing Date: Feb. 24, 2009.
"Non Final Office Action", U.S. Appl. No. 11/317,961, Mailing Date: Apr. 16, 2009.
"Notice of Allowance and Fees Due", U.S. Appl. No. 11/318,360, Mailing Date: Mar. 20, 2009.

* cited by examiner

US 8,048,329 B2

METHODS FOR IMPLEMENTING HIGHLY EFFICIENT PLASMA TRAPS

PRIORITY CLAIM

This divisional application claims priority under 37 CFR 1.53(b) of and claims the benefit under 35 U.S.C. §120 to a commonly assigned patent application entitled "Methods and Arrangement For Implementing Highly Efficient Plasma Traps," by Kamarehi et al., application Ser. No. 11/318,360 filed on Dec. 23, 2005 now U.S. Pat. No. 7,562,638, all of which is incorporated herein by reference.

BACKGROUND OF THE INVENTION

Plasma processing has continued to evolve as manufacturing companies attempt to stay competitive in the semiconductor industry. To gain a competitive advantage, different methods and arrangements have been implemented to increase the amount of plasma that may be utilized in substrate processing to produce non-defective devices One development that has shown continuing promise is the use of new and different geometries in plasma processing machines. Different geometries, such as long straight plasma tube and convoluted plasma tube, have been utilized in an attempt to efficiently absorb microwave power or convert absorbed microwave power into useful plasma species. To facilitate discussion, FIG. 1 shows a simple diagram of a prior art convoluted plasma tube assembly. Plasma 112 may be formed within a plasma tube 102 through the coupling of one or more gases (e.g., $O_2$, $N_2$, $N_2H_2$, $HeH_2$, water vapor, and fluorinated compounds) with microwave power, which may have been transmitted by a microwave power generator 106 through a waveguide 108. Those skilled in the arts are aware that conventional plasma tube of one inch or less in diameter may lose significant percentage of the microwave power that may be generated due to thermal loading. Since plasma 112 may include both harmful plasma species and useful plasma species, shape and dimension of plasma tubes may be manipulated to allow for harmful species to recombine into useful species. Consequently, different geometries may translate into higher efficiency apparatuses.

Consider the situation wherein, for example, plasma 112 travels through plasma tube 102 and encounters a bend 116. As plasma 112 interacts with walls of plasma tube 102 at bend 116, some of the plasma species may recombine. However, with a convoluted plasma tube, the chance for neutral species to recombine may have also increased. As a result, the more convoluted a plasma tube, the less efficient the plasma tube may be in delivering neutral species to a plasma processing chamber.

To reduce the number of useful plasma species from recombining, some manufacturers may use straight plasma tubes. Without a bend, the recombination rate of plasma species within plasma tube may be reduced. However, manufacturers may have to extend the plasma tube to minimize the possibility of harmful plasma species from reaching the plasma processing chamber.

Additionally, plasma species may be formed outside of the waveguide enclosed area of the plasma tube due to microwave radiation leakage that may occur. Traps have been used in some plasma tube assembly to limit the amount of leakage. Traps are usually hollow aluminum disk shape device, which may measure approximately 0.5 inches to 2 inches thick. However, in practice, not all microwave radiation may be contained and microwave leakage may occur resulting in power loss and an extension of harmful plasma species.

Although the geometry of plasma tubes and traps may provide a partial solution for delivering useful plasma species to plasma processing chamber, what are needed are methods and arrangement for creating a highly efficient downstream microwave plasma system.

SUMMARY OF INVENTION

The invention relates, in an embodiment, to a method for minimizing microwave leakage into a processing chamber of a microwave plasma system, wherein the microwave plasma system is configured for generating plasma and channeling at least a portion of the plasma downstream to the processing chamber. The method includes providing a plasma tube assembly, wherein the plasma tube assembly is a cylindrical structure positioned upstream from the processing chamber. The plasma tube assembly includes a plasma-sustaining region, wherein the plasma is formed when a gas mixture interacts with microwave power within the plasma-sustaining region. The method also includes securing a first set of plasma traps to the plasma tube assembly, which is a first set of electrically conductive disks surrounding the cylindrical structure and is positioned upstream from the processing chamber. The first set of plasma traps includes a first electrically conductive disk with a first downstream corrugated outer surface and a first upstream corrugated outer surface. The first downstream corrugated outer surface and the first upstream corrugated outer surface including a plurality of corrugated peaks. The first set of plasma traps also include a second electrically conductive disk with a second downstream corrugated outer surface and a second upstream corrugated outer surface. The second downstream corrugated outer surface and the second upstream corrugated outer surface include a plurality of corrugated peaks, wherein a corrugated outer surface of the second electrically conductive disk is facing a corrugated outer surface of the first electrically conductive disk in a space-apart relationship so as to form a first interstitial region between the first electrically conductive disk and the second electrically conductive disk, whereby the first electrically conductive disk, the second electrically conductive disk, and the first interstitial region form one of a set of upstream plasma traps and a set of downstream plasma traps relative to the plasma-sustaining region of the plasma tube assembly.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF VARIOUS EMBODIMENTS

The present invention will now be described in detail with reference to various embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

In accordance with embodiments of the present invention, there is provided a plasma generation arrangement for decreasing microwave leakage from a plasma-sustaining region within a downstream microwave plasma system that is configured to generate plasma and to channel plasma downstream to a plasma processing chamber. In some embodiments, plasma generation arrangement may include a plurality of traps to allow for more efficient absorption of microwave power. Embodiments of the invention also provide for plurality of traps to have a low profile configuration to enable more efficient delivery of useful plasma species to plasma processing chamber.

Figure 1:
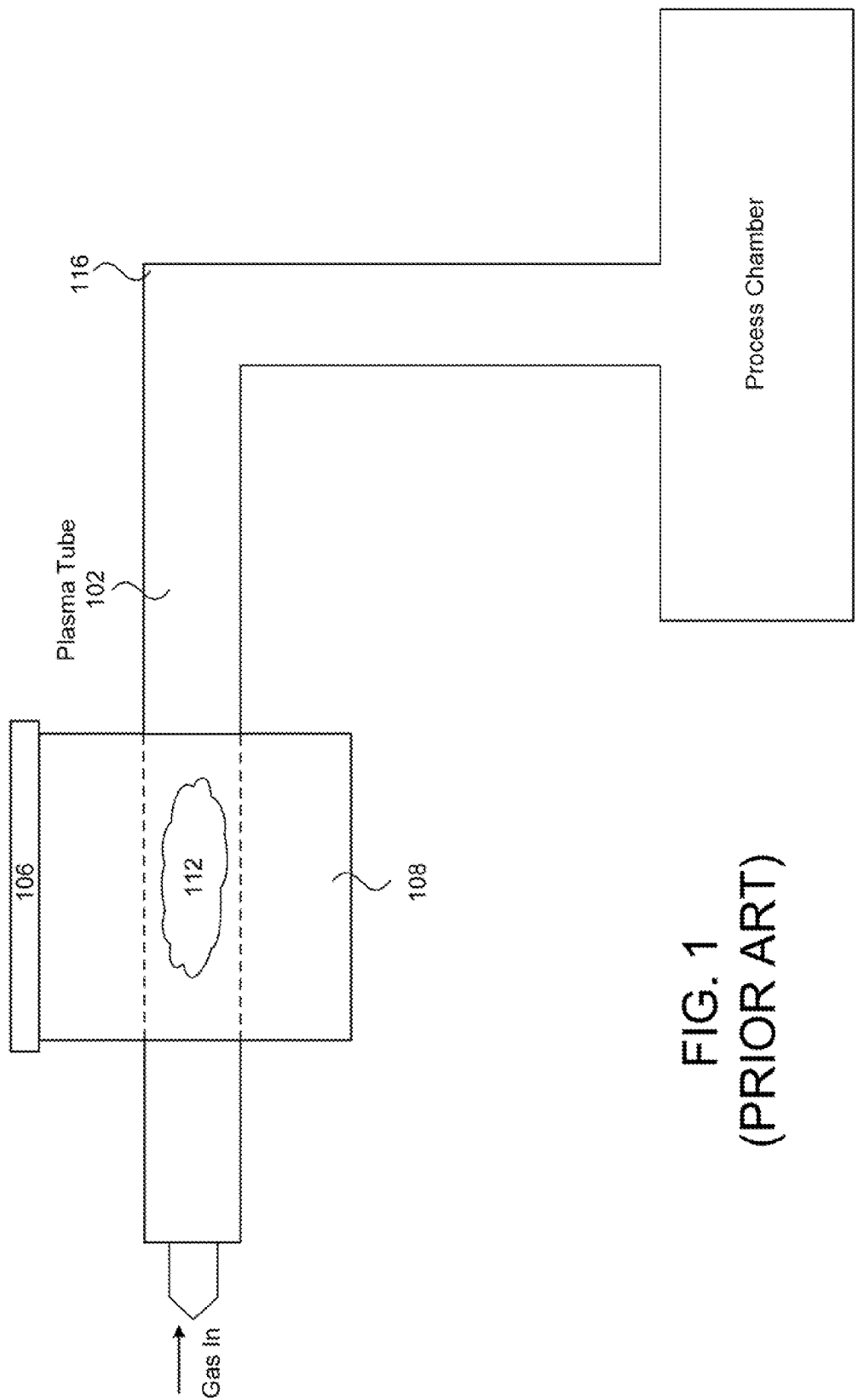
FIG. 1 shows a simple diagram of a prior art convoluted plasma tube assembly.
Figure 2:
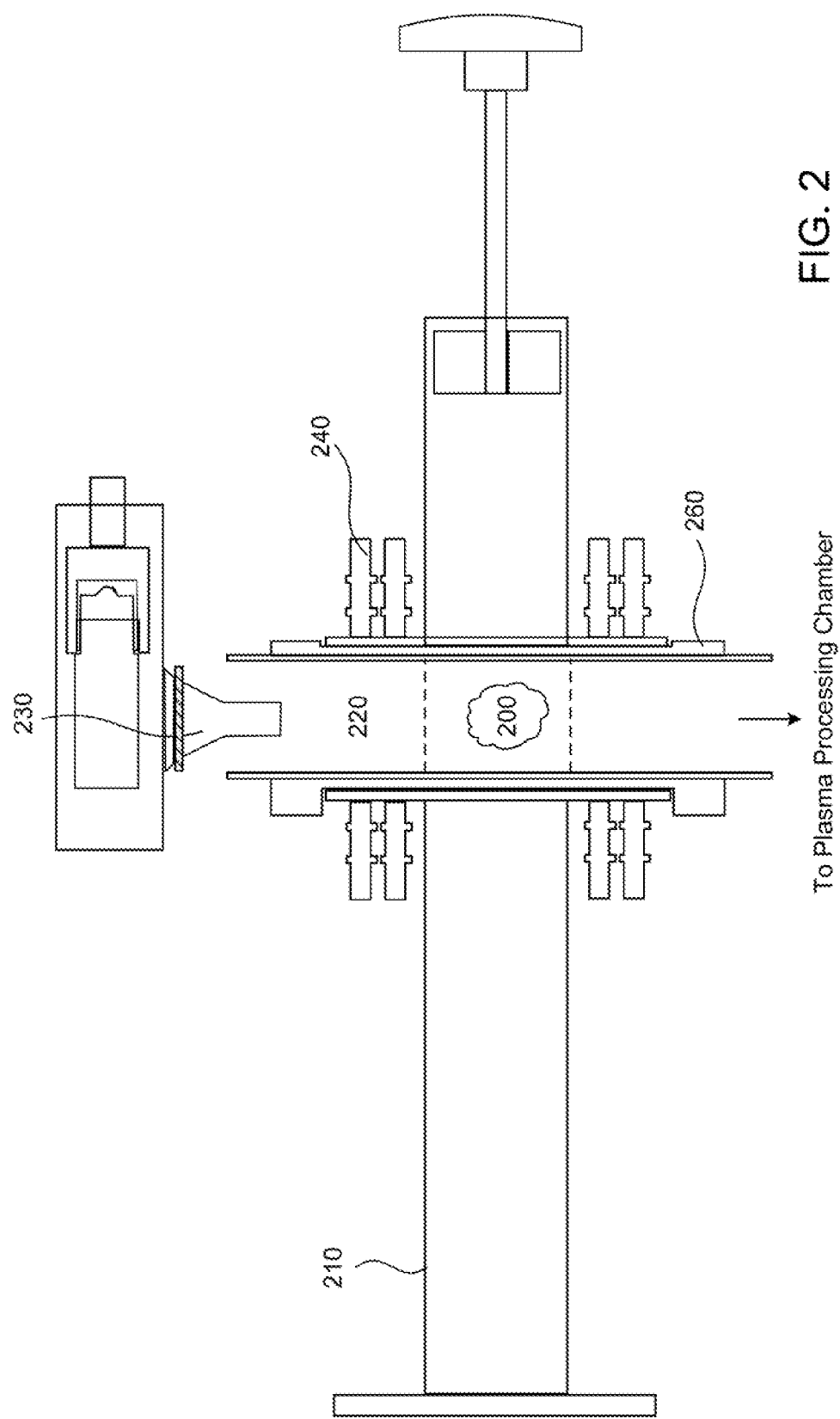
FIG. 2 shows, in an embodiment, a cross-section of a plasma generation arrangement.

FIG. 2 shows, in an embodiment, a cross-sectional view of a plasma generation arrangement. The plasma generation arrangement may include a microwave waveguide assembly 210, which may be capable of delivering microwave power to a plasma tube assembly 220. Plasma generation arrangement may also include a gas distribution assembly 230, which may inject one or more gases into plasma tube assembly 220. Within plasma tube assembly 220, microwave power may couple with one or more gases, such as $O_2$, $N_2$, $N_2H_2$, $HeH_2$, water vapor, and fluorinated compounds, to generate plasma 200. Further, plasma generation arrangement may include a plurality of plasma traps 240 to substantially reduce microwave radiation leakage that may occur. In addition, plasma generation arrangement may include a cooling assembly 260 to reduce thermal loading that may occur due to excess power.

Figure 3:
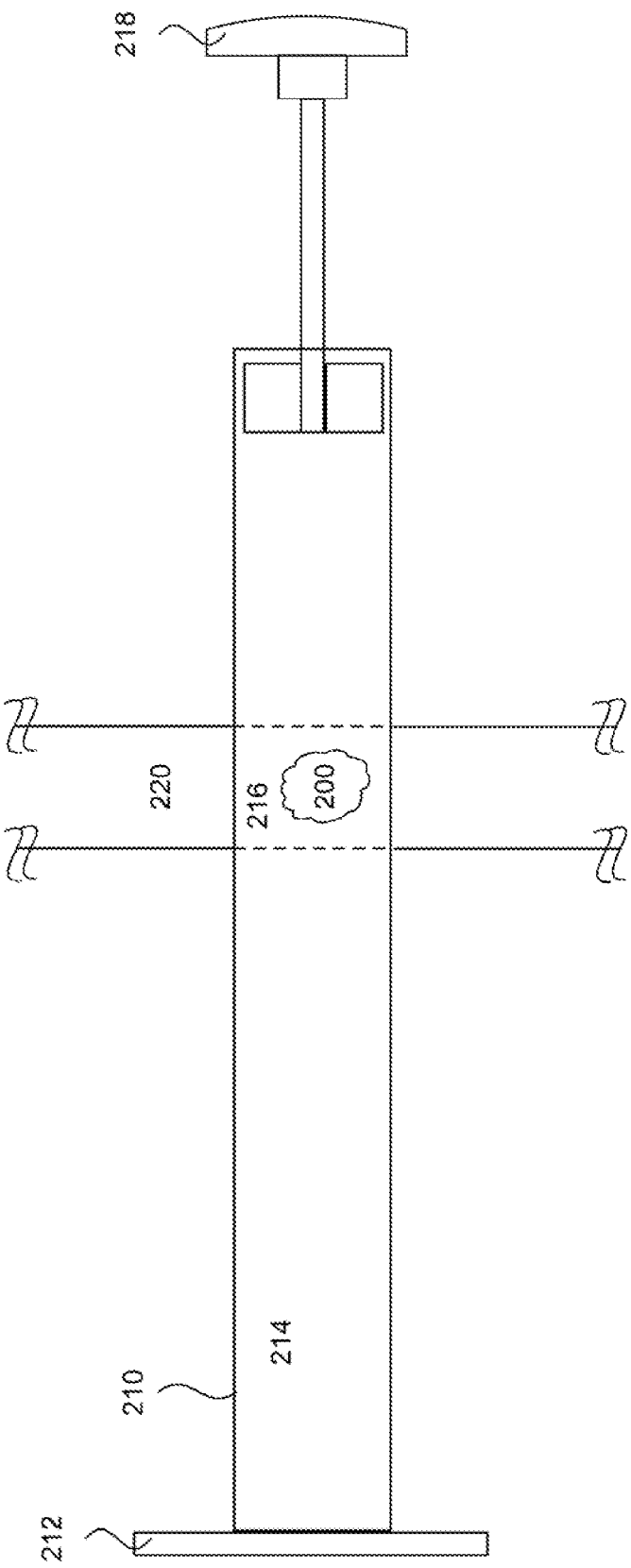
FIG. 3 shows, in an embodiment, a simple diagram of a microwave waveguide assembly.

FIG. 3 shows, in an embodiment, a simple diagram of microwave waveguide assembly 210, which may include a microwave power generator 212, such as Hitachi magnetron, and a waveguide 214. Microwave power generator 212 may send microwave power through waveguide 214 to a plasma-sustaining region 216 of plasma tube assembly 220. Microwave waveguide assembly 210, which may have a longitudinal axis parallel with a first axis, may intersect with plasma tube assembly 220, which may have a longitudinal axis parallel with a second axis that is substantially orthogonal with the first axis.

As discussed herein, a waveguide is a rectangular or cylindrical tube designed to direct microwave power. Waveguide 214 may extend across plasma-sustaining region 216 of plasma tube assembly 220. One end of waveguide 214 may include a sliding short 218. By manipulating sliding short 218, an operator may be able to adjust microwave power delivery within waveguide 214.

Figure 4:
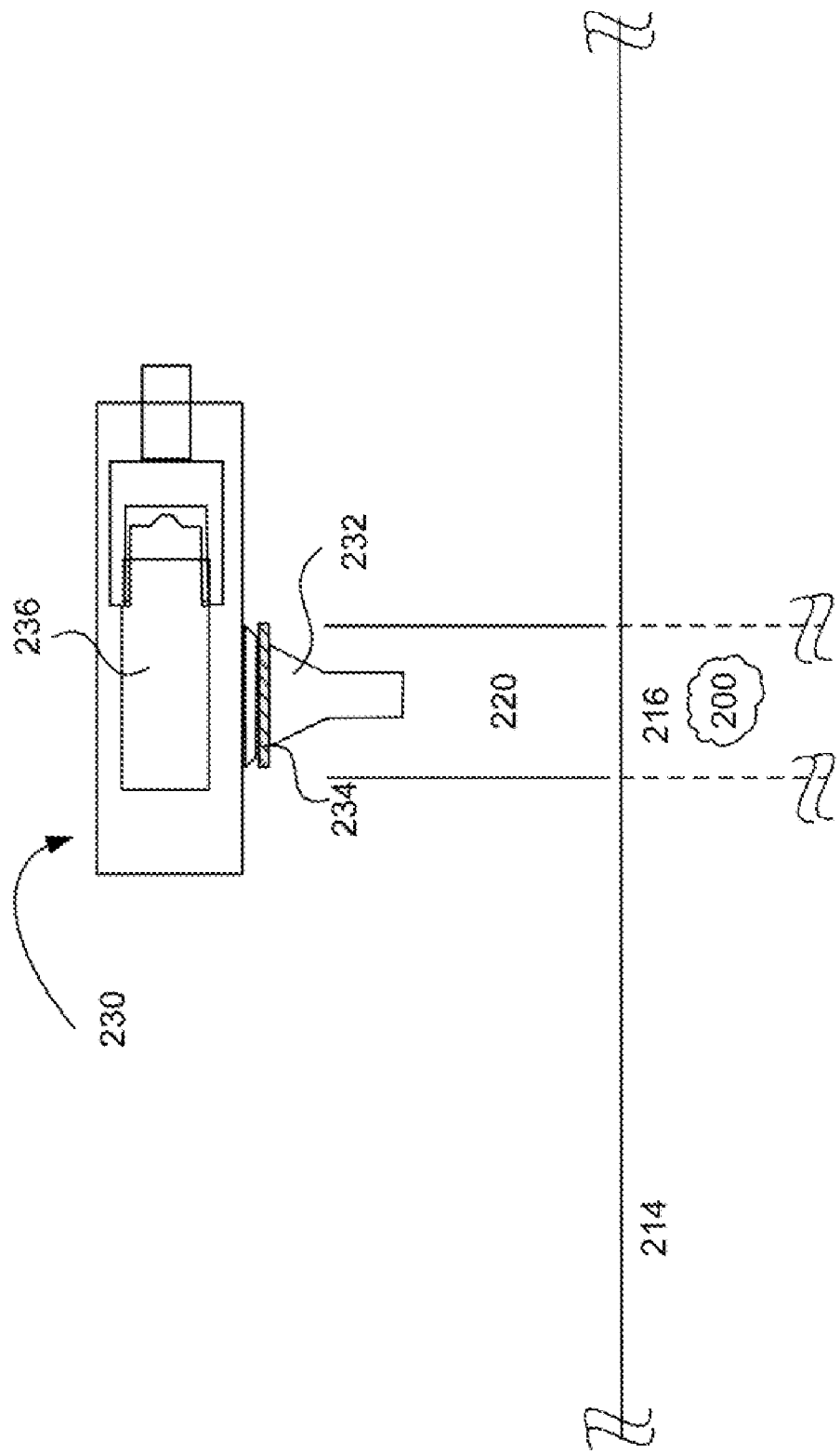
FIG. 4 shows, in an embodiment, a simple diagram of a gas distribution assembly.

FIG. 4 shows, in an embodiment, a simple diagram of gas distribution assembly 230. Gas distribution assembly 230 may include a gas distribution showerhead 232, which may introduce one or more gases into plasma-sustaining region 216 of plasma tube assembly 220. As noted above, microwave power may be coupled with gases to create plasma 200. Gas distribution showerhead 232 may further include an ultraviolet (UV) transparent window 234 with an igniter module 236. Igniter module 236 may be used to ignite plasma 200.

Figure 5:
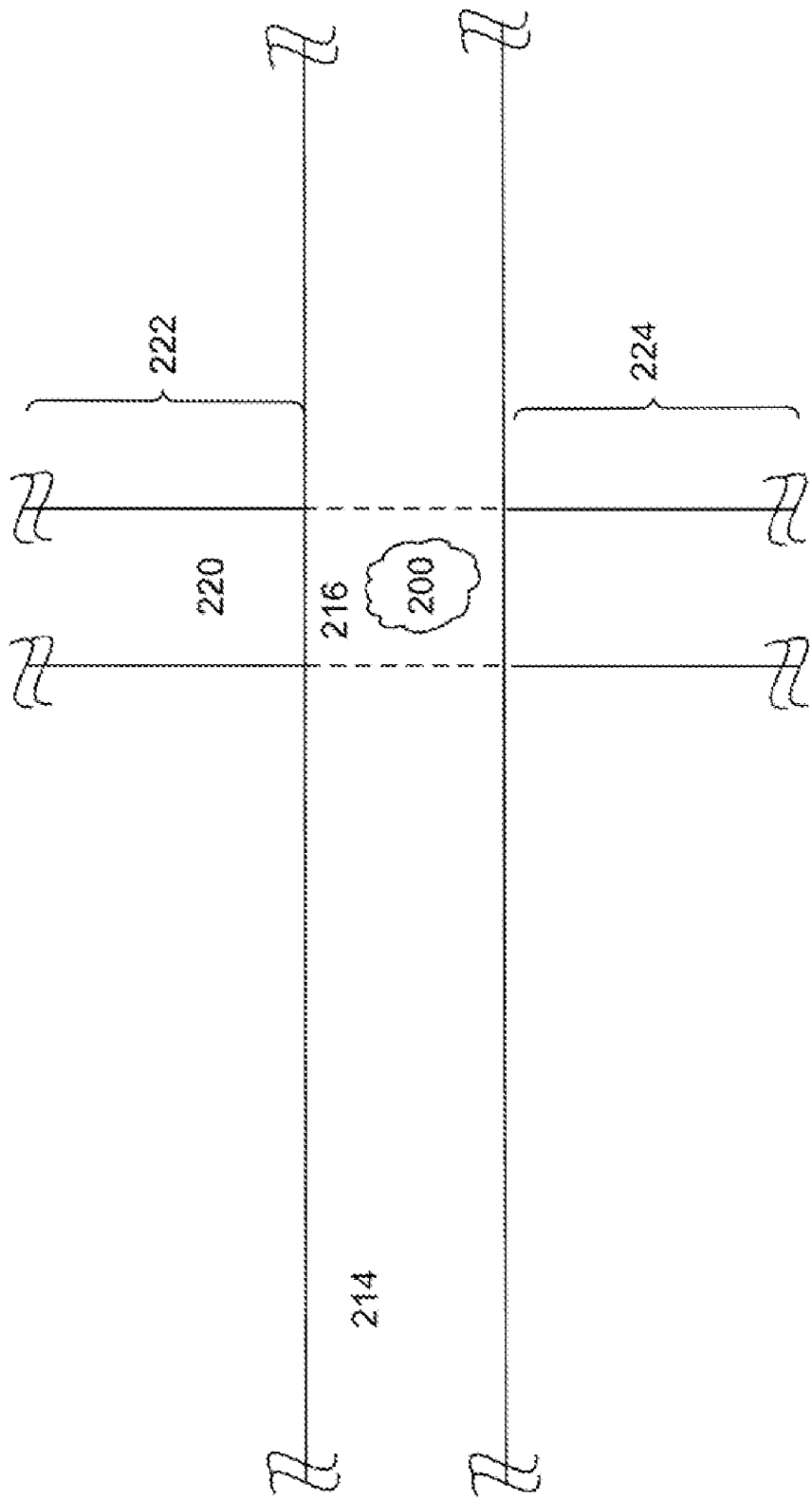
FIG. 5 shows, in an embodiment, a simple diagram of a plasma tube assembly coupled with a waveguide.

As noted above, microwave power and one or more gases may couple within plasma sustaining region 216 to generate plasma 200 that may be needed for substrate processing. FIG. 5 shows, in an embodiment, a simple diagram of plasma tube assembly 220 coupled with waveguide 214. Plasma tube assembly may be disposed substantially parallel with waveguide 214. Plasma tube 220 may be configured to allow plasma passage down to plasma processing chamber. Plasma tube assembly 220 may be a cylindrical structure that may be divided into three main sections: an upper section 222, a lower section 224, and plasma-sustaining region 216. As discussed herein, a plasma-sustaining region refers to a section of a plasma tube assembly that may be surrounded by a waveguide. Further, the plasma-sustaining region may be the area in which microwave power and one or more gases may couple to create plasma.

To provide a larger plasma-sustaining region, the geometry of plasma tube utilized has been altered. As noted above, prior art plasma tubes are generally configured having a diameter of about one inch in diameter. In an embodiment, the diameter of plasma tube assembly 220 may have a larger diameter than conventional tubes in the prior art.

In the prior art, generation of useful plasma species may reach a diminishing return at approximately 2300 watts due to the thermal loading that may occur in the plasma tube. For typical substrate processing using 3000 watts of microwave power at a frequency of 2450 MHz in a larger diameter configuration, plasma tube assembly 220 may provide for a larger volume in which plasma 200 may be generated. A larger volume may allow for less thermal loading, which in turn may result in a higher rate of absorbed microwave power to couple with one or more gases to generate plasma species. As discussed herein, plasma species may include both harmful and useful plasma species. Harmful plasma species may include, but are not limited to, UV photons and energetic species such as ions. Useful plasma species are usually neutral species such as radicals. Whereas harmful plasma species can damage a substrate and/or a process chamber, useful plasma species are needed to perform strip and/or non-critical etch on a substrate.

In another embodiment, plasma tube assembly 220 may be configured with a low profile in order to decrease wall surface area. With a smaller wall surface area, useful plasma species may have fewer opportunities to contact plasma tube assembly wall. Thus, one skilled in the art is aware that recombination rate may be reduced and the number of useful plasma species delivered to plasma processing chamber for substrate processing may be increased. The length of plasma tube assembly 220 may be determined by several factors including, but not limited to, the size of waveguide 214, the profile of plurality of plasma traps 240 (see FIG. 2), and the profile of cooling assembly 260 (see FIG. 2).

The size/shape of waveguide 214 may vary depend on microwave wavelength utilized and the mode for which the waveguide has been selected. In typical substrate processing, a microwave power generator employed may be capable of producing 3000 watts of microwave power at 2450 MHz. To support this amount of microwave power and minimize thermal loading, waveguide 214 may be a rectangular waveguide with a transverse electric sub 10 (TE10) mode, in an embodiment.

Another factor that may contribute to the shortened length of plasma tube assembly 220 may be the profile of plurality of plasma traps 240 as noted above. As discussed herein, plasma traps may be hollow and/or solid centered electrically conductive disks, which may surround a plasma tube assembly. Plasma traps are generally useful to direct microwave power and prevent microwave leakage. By preventing microwave leakage, plasma traps may prevent the extension of plasma beyond a waveguide enclosure resulting in less chance of harmful plasma species being created near the plasma processing chamber.

Figure 6:
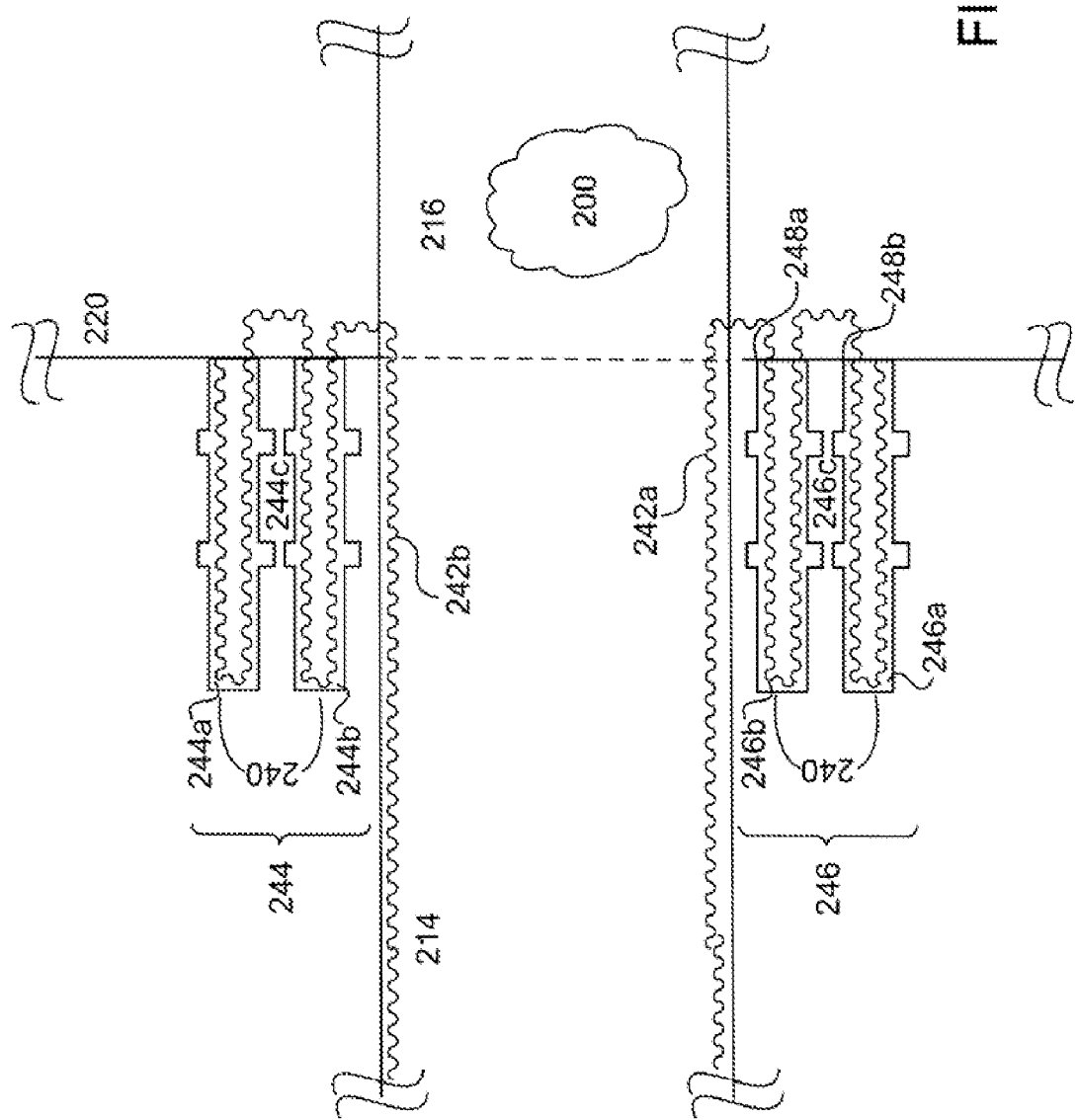
FIG. 6 shows, in an embodiment, a simple diagram of a plurality of plasma traps.

FIG. 6 shows, in an embodiment, a simple diagram of plurality of plasma traps. Plurality of plasma traps 240 may include one or more plasma traps. Plurality of plasma traps 240 may substantially eliminate microwave leakage, especially in process conditions that may include a large number of operational parameters. In an embodiment, plurality of plasma traps 240 may include two sets of plurality of plasma traps, an upstream set of plasma traps 244 and a downstream set of plasma traps 246.

In an embodiment, upstream set of plasma traps 244 may include an upstream outer plasma trap 244a and an upstream inner plasma trap 244b. Upstream inner plasma trap 244b may be disposed above waveguide 214. Upstream outer plasma trap 244a may be disposed above upstream inner plasma trap 244b to form a hollow or solid center disk-shape interstitial region 244c. In an embodiment, the interstitial region may be an air gap or may be filled with a material other than air, such as a solid material.

Similarly, downstream set of plasma traps 246 may include a downstream outer plasma trap 246a and a downstream inner plasma trap 246b. Downstream inner plasma trap 246b may be disposed below waveguide 214 and downstream outer plasma trap 246a may be disposed below downstream inner plasma trap 246b. Between downstream inner plasma trap 246b and downstream outer plasma trap 246a may be a hollow or solid center disk-shape interstitial region 246c, which may be an air gap or may be filled with a material other than air, such as a solid material.

Figure 7:
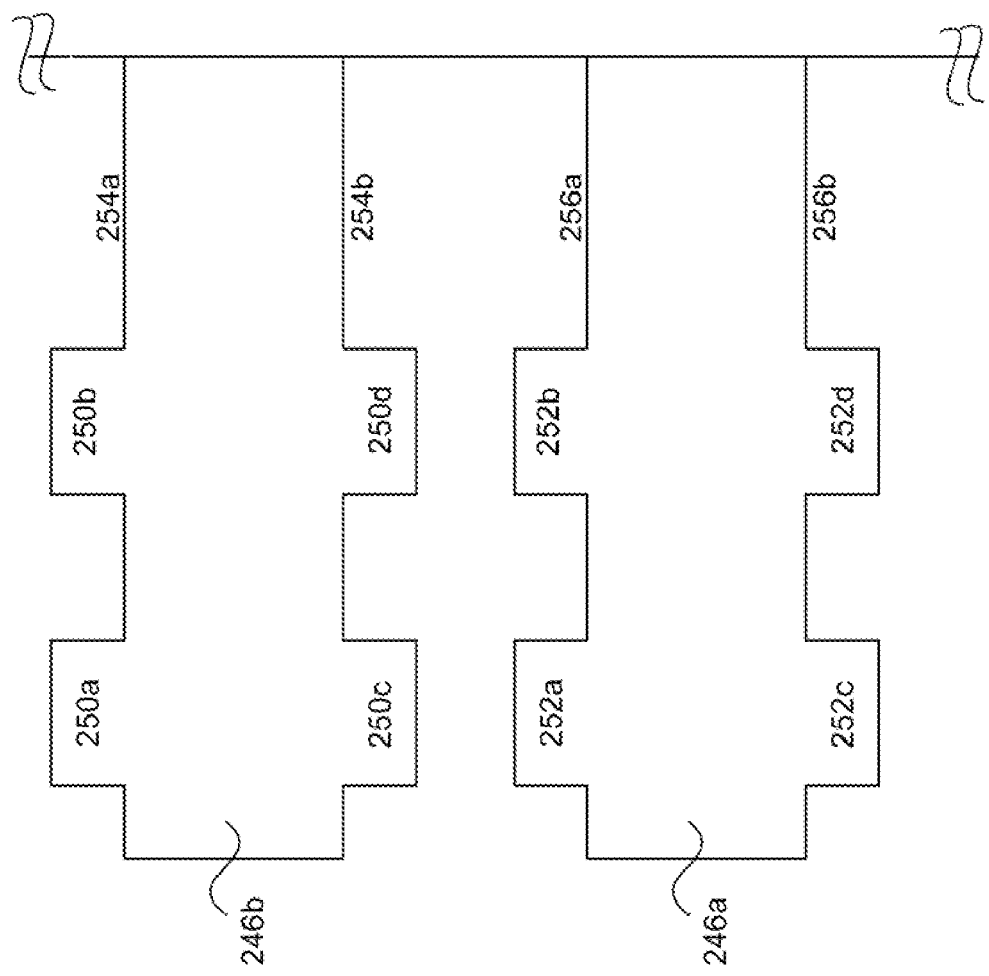
FIG. 7 shows, in an embodiment, plasma traps with corrugated surfaces and peaks.

In an embodiment, the surface of each plasma trap (244a, 244b, 246a, and 246b) may have corrugated surfaces with corrugated peaks as shown in FIG. 7. In an example, downstream inner plasma trap 246b may have an upstream corrugated surface 254a and a downstream corrugated surface 254b. On each corrugated surface may be a plurality of corrugated peaks (250a, 250b, 250c, and 250d). Similarly, downstream outer plasma trap 246a may have an upstream corrugated surface 256a and a downstream corrugated surface 256b. On each surface may be a plurality of corrugated peaks (252a, 252b, 252c, and 252d).

Even though only two plasma traps have been described for each set of plurality of plasma traps, each set may include any number of plasma traps. The plurality of plasma traps additionally, within each set, may be disposed similarly to the plurality of plasma traps described above. Also, each set of plurality of plasma traps may include different number of plasma traps. In an example, the upstream set of plasma traps may have two plasma traps while the downstream set of plasma traps may have three plasma traps to decrease the risk of microwave radiation leakage.

Figure 8:
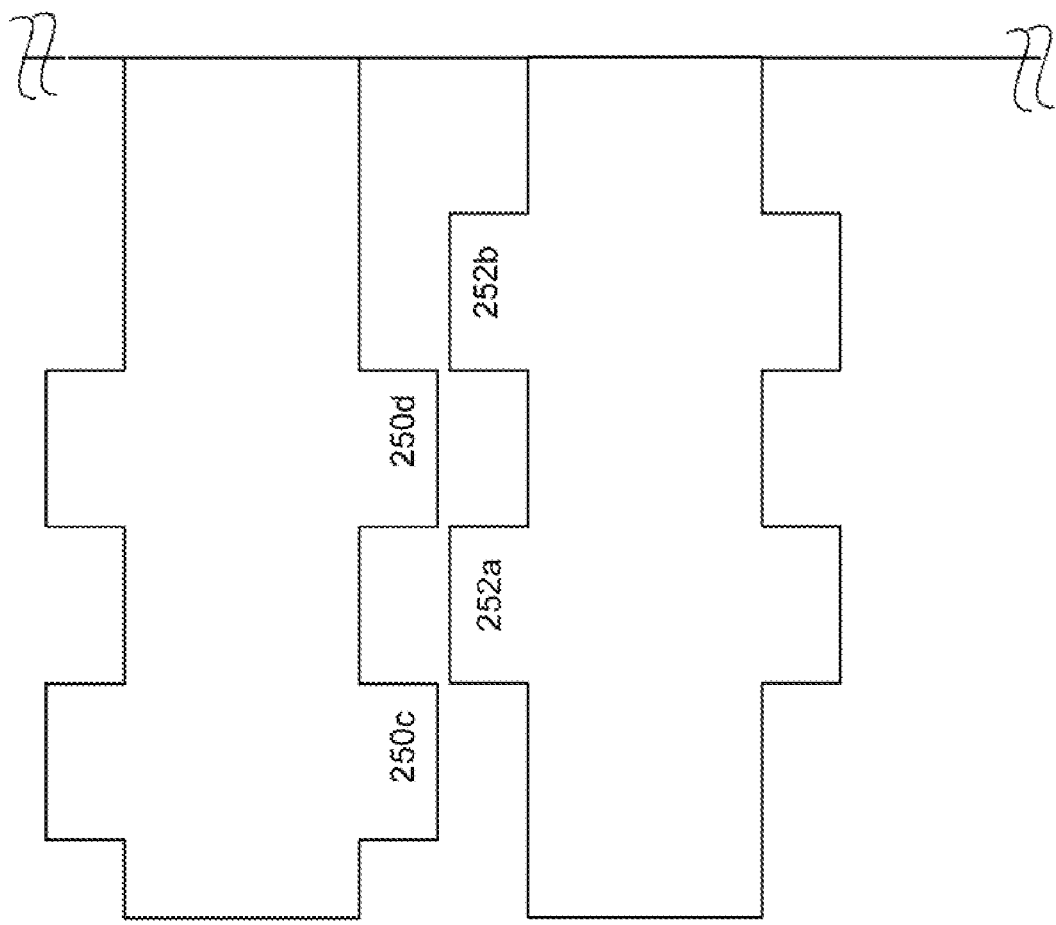
FIG. 8 shows, in an embodiment, how corrugated peaks of plasma traps may be offset.

FIG. 8 shows, in an embodiment, how the corrugated peaks may be offset. In an example, corrugated peaks 250c and 250d may be offset relative to corrugated peaks 252a and 252b. By offsetting the corrugated peaks, hollow or solid center disk-shape interstitial regions between each of the plasma traps may be minimized, thereby the length of the plasma tube assembly may be reduced.

As mentioned above, profile of the plurality of plasma traps may contribute to the profile of the plasma tube assembly. Although low profiles traps may be desired, the plurality of plasma traps must be large enough to prevent microwave leakage and to contain harmful plasma species. Those skilled in the art are aware that traps having a width of approximately a quarter of the wavelength of the microwave power may be able to maximize the voltage and minimize the current at the points of escape, thus, preventing or limiting microwave radiation leakage. In an embodiment, plurality of plasma traps may be corrugated, which may effectively reduce the electrical length of microwave power similar to that of a prior art single trap with dielectric material. Embodiment of the invention may further provide for corrugated plurality of plasma traps to be low profile and still remain effective.

Referring back to FIG. 6, microwave power tends to travel along the length of the waveguide (paths 242a and 242b). Consider the situation wherein, for example, microwave power has been introduced into waveguide 214. Microwave power may travel along path 242a to reach a point 248a where waveguide 214 and downstream inner plasma trap 246b may meet. At point 248a, impedance may be very high and current may be very low. In an example, if impedance is as high as infinite then current may be zero. Thus, microwave power may be effectively contained within the plurality of plasma trap and no microwave leakage may occur.

However, if microwave leakage does occur, then the microwave power may travel along the length of downstream inner plasma trap 246b to reach a corner 248b, which may also have very high impedance and very low current. Hence, any microwave leakage may be effectively contained within downstream outer plasma trap 246a. Similarly, upstream plurality of plasma traps 244 may capture microwave leakage that may travel along path 242b.

Figure 9:
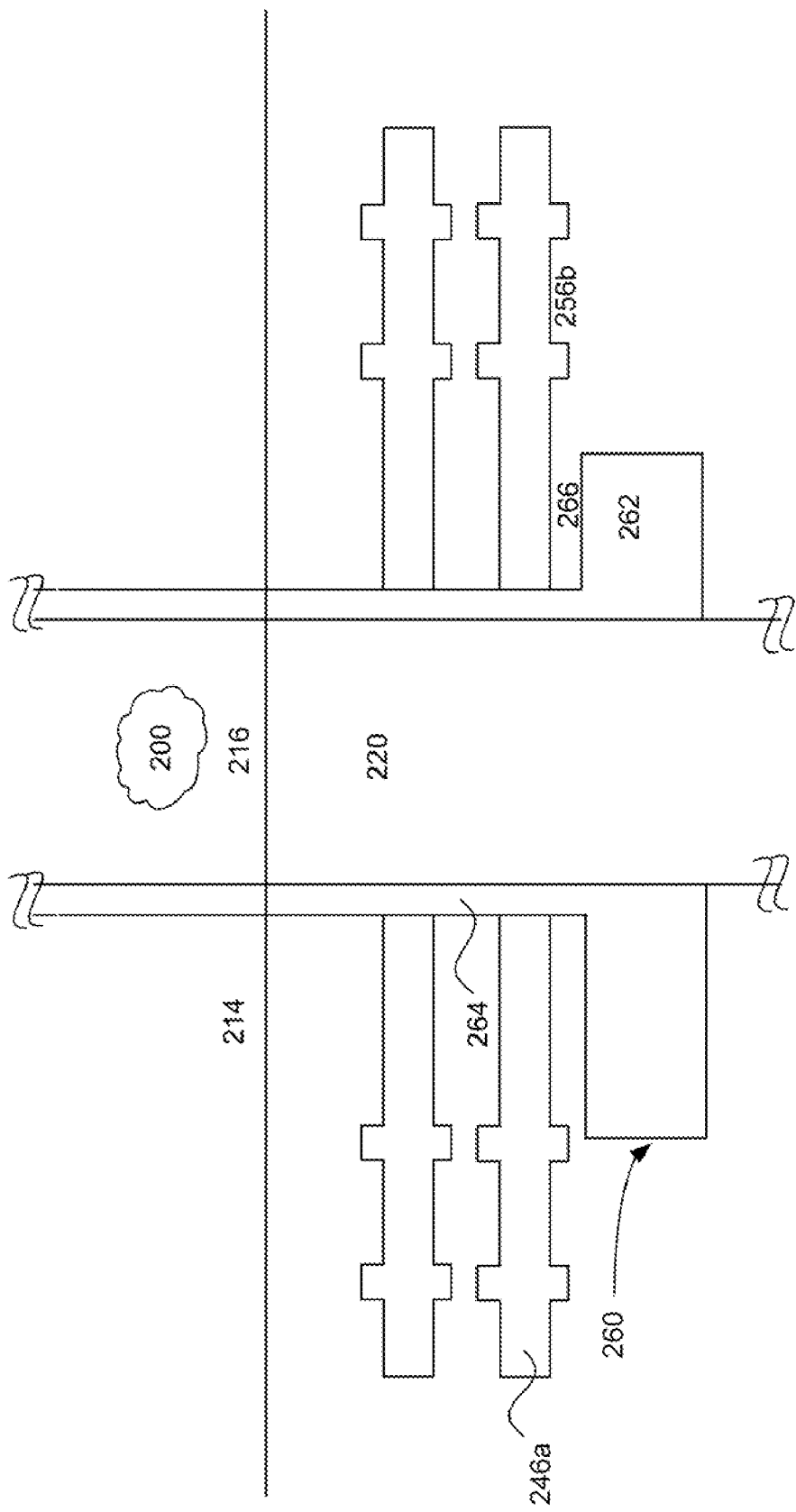
FIG. 9 shows, in an embodiment, a simple diagram of a cooling assembly.

A third factor that may affect the profile of a plasma tube assembly may be the size of a cooling assembly. FIG. 9 shows, in an embodiment, a simple diagram of cooling assembly 260. Cooling assembly 260 may include a cooling manifold 262 and a hollow cooling jacket 264. Coolant (i.e., heat-exchange fluid) may flow through cooling manifold 262 and up cooling jacket 264 to reduce thermal loading which in turn may reduce the recombination rate of plasma species.

To shorten the length of plasma tube assembly 220, the height of cooling manifold 262 may be reduced. However, cooling manifold 262 may still have to be large enough to effectively decrease thermal loading. In an embodiment, cooling manifold 262 may be located in close proximity to downstream outer plasma trap 246a. In an example, an upstream-facing surface 266 of downstream cooling manifold 262 may be adjacent to downstream-facing surface 256b of downstream outer plasma trap 246a. Unlike the prior art, there may be little or no air gap between downstream cooling manifold 262 and downstream outer plasma trap 246a, thereby, reducing the length of plasma tube assembly 220. Similarly, the same assembly may exist for an upstream cooling manifold in that the downstream-facing surface of an upstream cooling manifold may be adjacent (i.e. substantially no air gap) to an upstream-facing surface of an upstream outer plasma trap.

A coolant (e.g., Fluorinert FC-3283), which may be a microwave transparent fluid, may flow through cooling manifold 262 and up coolant jacket 264. Cooling jacket 264 may be a substantially cylindrical device that may surround plasma tube assembly 220. The coolant flowing through cooling jacket 264 may interact with plasma tube assembly 220 to facilitate heat transfer and effectively reduce the thermal loading that may occur, especially in plasma-sustaining region 216.

Over time, coolant may cause cooling assembly to deteriorate. In an embodiment, cooling assembly 260 may be made up of ceramic since ceramic may react less with the coolant than other materials. Further, since ceramic is opaque to the light spectra emitted by plasma 200, ceramic may block some of the radiation and may prevent damage to other components of the downstream microwave plasma system.

As can be appreciated from embodiments of the invention, the low profile plasma generation arrangement effectively reduces cost by generating more useful plasma species with the amount of microwave power typically employed in normal substrate processing. Thus, a highly efficient downstream microwave plasma system is created to provide for a more cost efficient isotropic substrate processing.

While this invention has been described in terms of several embodiments, there are alterations, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method for minimizing microwave leakage into a processing chamber of a microwave plasma system, wherein said microwave plasma system is configured for generating plasma and channeling at least a portion of said plasma downstream to said processing chamber, comprising:

providing a plasma tube assembly, wherein said plasma tube assembly is a cylindrical structure positioned upstream from said processing chamber, said plasma tube assembly including a plasma-sustaining region, wherein said plasma is formed when a gas mixture interacts with microwave power within said plasma-sustaining region; and securing a first set of plasma traps to said plasma tube assembly, said first set of plasma traps being a first set of electrically conductive disks surrounding said cylindrical structure, wherein said first set of plasma traps being positioned upstream from said processing chamber and said first set of plasma traps including at least a first electrically conductive disk with a first downstream corrugated outer surface and a first upstream corrugated outer surface, said first downstream corrugated outer surface and said first upstream corrugated outer surface including a plurality of corrugated peaks, and a second electrically conductive disk with a second downstream corrugated outer surface and a second upstream corrugated outer surface, said second downstream corrugated outer surface and said second upstream corrugated outer surface including a plurality of corrugated peaks, wherein a corrugated outer surface of said second electrically conductive disk is facing a corrugated outer surface of said first electrically conductive disk in a space-apart relationship so as to form a first interstitial region between said first electrically conductive disk and said second electrically conductive disk, whereby said first electrically conductive disk, said second electrically conductive disk, and said first interstitial region form one of a set of upstream plasma traps and a set of downstream plasma traps relative to said plasma-sustaining region of said plasma tube assembly.

2. The method of claim 1 wherein said first set of plasma traps form said set of downstream plasma traps that is disposed downstream from said plasma-sustaining region, said method further including securing a second set of plasma traps to said plasma tube assembly, said second set of plasma traps being said set of upstream plasma traps, said set of upstream plasma traps being a second set of electrically conductive disks surround said cylindrical structure, wherein said set of upstream plasma traps being positioned upstream from said plasma-sustaining region and including at least a third electrically conductive disk with a third downstream corrugated outer surface and a third upstream corrugated outer surface, said third downstream corrugated outer surface and said third upstream corrugated outer surface including a plurality of corrugated peaks, and a fourth electrically conductive disk with a fourth downstream corrugated outer surface and a fourth upstream corrugated outer surface, said fourth downstream corrugated outer surface and said fourth upstream corrugated outer surface including a plurality of corrugated peaks, wherein said fourth electrically conductive disk is positioned upstream from said third electrically conductive disk, wherein said third upstream corrugated outer surface is facing said fourth downstream corrugated outer surface in a space-apart relationship so as to form a second interstitial region between said third electrically conductive disk and said fourth electrically conductive disk.

3. The method of claim 2 wherein said first set of electrically conductive disks is one of a set of hollow center electrically conductive disks and a set of solid center electrically conductive disks.

4. The method of claim 2 wherein said second set of electrically conductive disks is one of a set of hollow center electrically conductive disks and a set of solid center electrically conductive disks.

5. The method of claim 2 wherein said first interstitial region forms one of
an air gap, and
a solid material other than air.

6. The method of claim 2 wherein said second interstitial region forms one of
an air gap, and
a solid material other than air.

7. The method of claim 2 wherein said second electrically conductive disk is positioned downstream from said first electrically conductive disk, wherein said plurality of corrugated peaks of said first downstream corrugated outer surface are offset relative to said plurality of corrugated peaks of said second upstream corrugated outer surface.

8. The method of claim 2 wherein said set of downstream plasma traps further includes a fifth electrically conductive disk with a fifth downstream corrugated outer surface and a fifth upstream corrugated outer surface, said fifth downstream corrugated outer surface and said fifth upstream corrugated outer surface including plurality of corrugated peaks, wherein said fifth electrically conductive disk is positioned downstream from said second electrically conductive disk, wherein said fifth upstream corrugated outer surface is facing said second downstream corrugated outer surface in a space-apart relationship so as to form a third interstitial region between said second electrically conductive disk and said fifth electrically conductive disk.

9. The method of claim 2 further including securing a downstream cooling manifold to said plasma tubing arrangement, said downstream cooling manifold being disposed in at least one of a first assembly arrangement and a second assembly arrangement relative to said set of downstream plasma traps, said first assembly arrangement being characterized by having substantially no air gap between an upstream-facing surface of said downstream cooling manifold and a downstream-facing surface of said set of downstream plasma traps, said second assembly arrangement being characterized by said downstream cooling manifold being disposed adjacent to said set of downstream plasma traps.

10. A method for containing plasma within a plasma tube assembly of a downstream microwave plasma system, said downstream microwave plasma system being configured for generating plasma within a plasma-sustaining region of said plasma tube assembly and channeling at least a portion of said plasma downstream to a processing chamber of said downstream microwave plasma system, comprising:

providing a first hollow center electrically conductive disk surrounding a cylindrical structure that defines a plasma passage of said plasma tube assembly;

securing a second hollow center electrically conductive disk in a spaced-apart relationship relative to said first hollow center electrically conductive disk so as to form a first hollow center disk-shape interstitial region between said first hollow center electrically conductive disc and said second hollow center electrically conductive disc, said second hollow center electrically conductive disk also surrounding said cylindrical structure; and securing a third hollow center electrically conductive disk in a spaced-apart relationship relative to said second hollow center electrically conductive disk so as to form a second hollow center disk-shape interstitial region between said third hollow center electrically conductive disc and said second hollow center electrically conductive disc, said third hollow center electrically conductive disk also surrounding said cylindrical structure, whereby said first hollow center electrically conductive disk, said second hollow center electrically conductive disk, said third hollow center electrically conductive disk, said first hollow center disk-shape interstitial region, and said second hollow center disk-shape interstitial region form one of a set of upstream plasma traps and a set of downstream plasma traps relative to said plasma-sustaining region of said plasma tube assembly.

11. The method of claim 10 wherein said first hollow center electrically conductive disk, said second hollow center electrically conductive disk and said third hollow center electrically conductive disk are formed of aluminum.

12. The method of claim 10 wherein said first hollow center electrically conductive disk has at least a first corrugated surface facing one of an upstream direction and a downstream direction.

13. The method of claim 10 wherein said second hollow center electrically conductive disk has at least a second corrugated surface facing said first corrugated surface.

14. The method of claim 10 wherein said cylindrical structure includes an inner cylindrical wall and an outer cylindrical wall, a space between said inner cylindrical wall and said outer cylindrical wall being employed to circulate a heat-exchange fluid to facilitate heat transfer from said cylindrical structure to said heat-exchange fluid.

15. The method of claim 10 wherein corrugated peaks in said first corrugated surface are offset relative to corrugated peaks in said second corrugated surface.

16. The method of claim 15 wherein said first hollow center disk-shape interstitial region and said second hollow center disk-shape interstitial region form air gaps.

17. The method of claim 15 wherein said first hollow center disk-shape interstitial region and said second hollow center disk-shape interstitial region are formed of a solid material other than air.

18. The method of claim 10 wherein said first hollow center electrically conductive disk, said second hollow center electrically conductive disk, and said first hollow center disk-shape interstitial region form said set of upstream plasma traps that is disposed upstream of a microwave waveguide, said method further including:

providing a fourth hollow center electrically conductive disk surrounding said cylindrical structure;

securing a fifth hollow center electrically conductive disk in a spaced-apart relationship relative to said fourth hollow center electrically conductive disk so as to form a third hollow center disk-shape interstitial region between said fourth hollow center electrically conductive disc and said fifth hollow center electrically conductive disc, said fifth hollow center electrically conductive disk also surrounding said cylindrical structure; and securing a sixth hollow center electrically conductive disk in a spaced-apart relationship relative to said fifth hollow center electrically conductive disk so as to form a fourth hollow center disk-shape interstitial region between said sixth hollow center electrically conductive disc and said fifth hollow center electrically conductive disk, said sixth hollow center electrically conductive disk also surrounding said cylindrical structure, whereby said fourth hollow center electrically conductive disk, said fifth hollow center electrically conductive disk, said sixth hollow center electrically conductive disk, said third hollow center disk-shape interstitial region, and said fourth hollow center disk-shape interstitial region forming said set of downstream plasma traps that is disposed downstream relative to said microwave waveguide.

19. The method of claim 18 wherein said third hollow center disk-shape interstitial region and said fourth hollow center disk-shape interstitial region form air gaps.

20. The method of claim 18 wherein said third hollow center disk-shape interstitial region and said fourth hollow center disk-shape interstitial region are formed of a solid material other than air.

* * * * *